United States Patent
Chowdhury et al.

(10) Patent No.: US 9,780,804 B1
(45) Date of Patent: Oct. 3, 2017

(54) SUCCESSIVE APPROXIMATION REGISTER ANALOG TO DIGITAL CONVERTER WITH MULTIPLE SPLIT DIGITAL TO ANALOG CONVERTORS

(71) Applicant: Synaptics Incorporated, San Jose, CA (US)

(72) Inventors: Golam Rasul Chowdhury, Austin, TX (US); Mucahit Kozak, Austin, TX (US); Steve Chikin Lo, Sunnyvale, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 15/199,750

(22) Filed: Jun. 30, 2016

(51) Int. Cl.
- H03M 1/12 (2006.01)
- H03M 1/46 (2006.01)
- H03M 1/80 (2006.01)
- H03M 1/68 (2006.01)
- H03M 1/10 (2006.01)

(52) U.S. Cl.
CPC ........... *H03M 1/466* (2013.01); *H03M 1/804* (2013.01); *H03M 1/1061* (2013.01); *H03M 1/468* (2013.01); *H03M 1/68* (2013.01)

(58) Field of Classification Search
CPC .......... H03M 1/38; H03M 1/40; H03M 1/403; H03M 1/462; H03M 1/466
USPC ................................................. 341/156, 172
See application file for complete search history.

(56) References Cited

U.S. PATENT DOCUMENTS

| | | | | |
|---|---|---|---|---|
| 4,999,633 A * | 3/1991 | Draxelmayr | ........ | H03M 1/1047 341/118 |
| 5,889,486 A * | 3/1999 | Opris | ...................... | H03M 1/68 341/144 |
| 6,400,299 B2 * | 6/2002 | Ikeda | ...................... | H03M 1/68 341/144 |
| 6,686,865 B2 * | 2/2004 | Confalonieri | ........... | H03M 1/68 341/156 |
| 6,985,101 B2 * | 1/2006 | Leung | ................. | H03M 1/1057 341/163 |
| 7,286,075 B2 * | 10/2007 | Hennessy | ........... | H03M 1/0639 341/144 |
| 7,746,262 B2 * | 6/2010 | Chowdhury | .......... | H03M 1/462 341/161 |
| 8,035,622 B2 * | 10/2011 | Hotelling | .............. | G06F 3/0416 341/126 |

(Continued)

*Primary Examiner* — Khai M Nguyen
(74) *Attorney, Agent, or Firm* — Osha Liang LLP

(57) ABSTRACT

A digital to analog convertor comprises an output line; first, second and third pluralities of capacitors; and first and second bridge capacitors. The first plurality of capacitors is coupled in parallel with one another, coupled with the output line, and comprises a first least significant bit capacitor of a first capacitance value. The second plurality of capacitors is coupled in parallel with one another, coupled with the output line, and comprises a second capacitor of the first capacitance value. The third plurality of capacitors is coupled in parallel with one another, coupled with the output line, and comprises a third capacitor of the first capacitance value. The first bridge capacitor bridges the output line between the first plurality of capacitors and the second plurality of capacitors. The second bridge capacitor bridges the output line between the second plurality of capacitors and the third plurality of capacitors.

16 Claims, 10 Drawing Sheets

(56) References Cited

U.S. PATENT DOCUMENTS

| | | | | |
|---|---|---|---|---|
| 8,659,459 B2* | 2/2014 | Kim | ................... | H03M 1/0678 |
| | | | | 341/144 |
| 8,947,290 B2* | 2/2015 | Miki | ................... | H03M 1/1061 |
| | | | | 341/118 |
| 9,013,442 B2* | 4/2015 | Hotelling | .............. | G06F 3/0416 |
| | | | | 178/18.06 |
| 9,432,037 B2* | 8/2016 | Oh | ......................... | H03M 1/06 |

* cited by examiner

SUCCESSIVE APPROXIMATION REGISTER ANALOG TO DIGITAL CONVERTER WITH MULTIPLE SPLIT DIGITAL TO ANALOG CONVERTORS

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones and tablet computers). Such touch screen input devices are typically superimposed upon or otherwise collocated with a display of the electronic system. Such input devices have components which collect analog signals that are representative of inputs and then convert these signals to digital values for further processing.

SUMMARY

A digital to analog convertor comprises an output line; first, second and third pluralities of capacitors; and first and second bridge capacitors. The first plurality of capacitors is coupled in parallel with one another, coupled with the output line, and comprises a first least significant bit capacitor of a first capacitance value. The second plurality of capacitors is coupled in parallel with one another, coupled with the output line, and comprises a second capacitor of the first capacitance value. The third plurality of capacitors is coupled in parallel with one another, coupled with the output line, and comprises a third capacitor of the first capacitance value. The first bridge capacitor bridges the output line between the first plurality of capacitors and the second plurality of capacitors. The second bridge capacitor bridges the output line between the second plurality of capacitors and the third plurality of capacitors.

BRIEF DESCRIPTION OF DRAWINGS

The drawings referred to in this Brief Description of Drawings should not be understood as being drawn to scale unless specifically noted. The accompanying drawings, which are incorporated in and form a part of the Description of Embodiments, illustrate various embodiments and, together with the Description of Embodiments, serve to explain principles discussed below, where like designations denote like elements, and.

DESCRIPTION OF EMBODIMENTS

The following Description of Embodiments is merely provided by way of example and not of limitation. Furthermore, there is no intention to be bound by any expressed or implied theory presented in the preceding Background, Summary, or Brief Description of Drawings or the following Description of Embodiments.

Overview of Discussion

Herein, various embodiments are described that provide input devices, processing systems, and methods that facilitate improved usability. In various embodiments described herein, the input device may be a capacitive sensing input device. Utilizing techniques described herein, efficiencies may be achieved by implementing digital to analog convertors using smaller capacitors than is conventionally possible with equivalent bit-sized convertors. Like pairs of these digital to analog convertors may be utilized in a successive approximation register analog to digital convertor, which may in turn be used in a processing system for an input device. Because smaller capacitors have a faster settling time than larger capacitors, digital to analog convertors described herein can work faster than their conventional counterparts. Because smaller capacitors utilize less surface area on an integrated circuit, digital to analog convertors described herein take up less room (less surface area) on an integrated circuit than their conventional counterparts. Because smaller capacitors use less energy ($\frac{1}{2}\ CV^2$) than larger capacitors, digital to analog converters described herein use less energy to operate and are thus more energy efficient than their conventional counterparts. Because smaller capacitors can settle faster, digital to analog convertors described herein can employ smaller switches to sample signals through their capacitors than would be possible with the larger capacitors used in the conventional counterpart digital to analog convertors. Using smaller switches requires less power and less surface area on an integrated circuit than would be required with a conventional counterpart digital to analog convertor.

Discussion begins with a description of an example input device with which or upon which various embodiments described herein may be implemented. An example sensor electrode pattern is then described. This is followed by description of an example processing system and some components thereof, including an analog front end. The processing system may be utilized with or as a portion of an input device, such as a capacitive sensing input device. Several examples of digital to analog convertors which have multiple splits and three or more split portions are discussed. Block diagrams are then provided of some successive approximation register analog to digital convertors that utilize like pairs of the digital to analog convertors described herein.

Example Input Device

Figure 1:
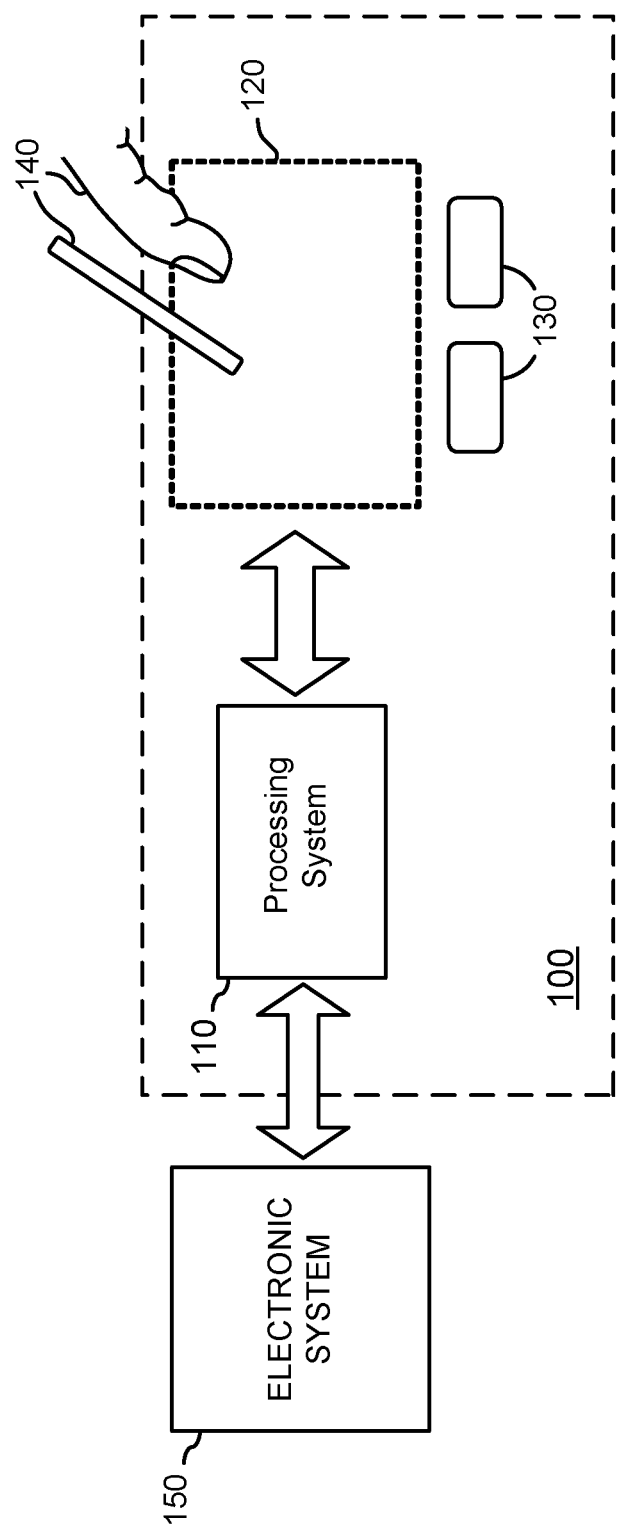
FIG. 1 is a block diagram of an example input device, in accordance with embodiments.

Turning now to the figures, FIG. 1 is a block diagram of an example input device 100, in accordance with various embodiments. Input device 100 may be configured to provide input to an electronic system/device 150. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic systems could be a host or a slave to the input device.

Input device 100 can be implemented as a physical part of an electronic system 150, or can be physically separate from electronic system 150. As appropriate, input device 100 may communicate with parts of the electronic system using any one or more of the following: buses, networks, and other wired or wireless interconnections. Examples include, but are not limited to: Inter-Integrated Circuit (I2C), Serial Peripheral Interface (SPI), Personal System 2 (PS/2), Universal Serial Bus (USB), Bluetooth®, Radio Frequency (RF), and Infrared Data Association (IrDA).

In FIG. 1, input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near input device 100, in which input device 100 is able to detect user input (e.g., user input provided by one or more input objects 140). The sizes, shapes, and locations of particular sensing regions may vary widely from embodiment to embodiment. In some embodiments, sensing region 120 extends from a surface of input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of input device 100, contact with an input surface (e.g., a touch surface) of input device 100, contact with an input surface of input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, sensing region 120 has a rectangular shape when projected onto an input surface of input device 100.

Input device 100 may utilize any combination of sensor components and sensing technologies to detect user input in the sensing region 120. Input device 100 comprises one or more sensing elements for detecting user input. As several non-limiting examples, input device 100 may use acoustic, ultrasonic, capacitive, elastive, resistive, inductive, and/or optical techniques.

Some implementations are configured to provide images that span one, two, three, or higher dimensional spaces. Some implementations are configured to provide projections of input along particular axes or planes.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements pick up loop currents induced by a resonating coil or pair of coils. Some combination of the magnitude, phase, and frequency of the currents may then be used to determine positional information.

In some capacitive implementations of input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Collectively transmitters and receivers may be referred to as sensor electrodes or sensor elements. Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive.

In some embodiments, one or more receiver electrodes may be operated to receive a resulting signal when no transmitter electrodes are transmitting (e.g., the transmitters are disabled). In this manner, the resulting signal represents noise detected in the operating environment of sensing region 120. In this manner, in some embodiments, the resulting signal represents noise detected in the operating environment of sensing region 120. For example, display noise of a nearby or co-located (e.g., overlapping) display may be represented in the resulting signal that is received during transcapacitive sensing.

In FIG. 1, a processing system 110 is shown as part of input device 100. Processing system 110 is configured to operate the hardware of input device 100 to detect input in sensing region 120. Processing system 110 comprises parts of or all of one or more integrated circuits (ICs) and/or other circuitry components. (For example, a processing system for a mutual capacitance (i.e., transcapacitive) sensor device may comprise transmitter circuitry configured to transmit signals with transmitter sensor electrodes, and/or receiver circuitry configured to receive signals with receiver sensor electrodes). In some embodiments, processing system 110 also comprises electronically-readable instructions, such as firmware code, software code, and/or the like. In some embodiments, components composing processing system 110 are located together, such as near sensing element(s) of input device 100. In other embodiments, components of processing system 110 are physically separate with one or more components close to sensing element(s) of input device 100, and one or more components elsewhere. For example, input device 100 may be a peripheral coupled to a desktop computer, and processing system 110 may comprise software configured to run on a central processing unit of the desktop computer and one or more ICs (perhaps with associated firmware) separate from the central processing unit. As another example, input device 100 may be physically integrated in a phone, and processing system 110 may comprise circuits and firmware that are part of a main processor of the phone. In some embodiments, processing system 110 is dedicated to implementing input device 100. In other embodiments, processing system 110 also performs other functions, such as operating display screens, driving haptic actuators, etc.

Processing system 110 may be implemented as a set of modules that handle different functions of processing system 110. Each module may comprise circuitry that is a part of processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor modules configured to operate sensing element(s) or other structures to detect input and determination modules configured to determine positions of any inputs objects detected. For example, a sensor module may perform one or more of absolute capacitive sensing and transcapacitive sensing to detect inputs, and a determination module may determine positions of inputs based on the detected capacitances or changes thereto. In some embodiments, other modules or functionality may be included in processing system 110; for example, an identification module may be included and configured to identify gestures from detected inputs.

In some embodiments, processing system 110 responds to user input (or lack of user input) in sensing region 120 directly by causing one or more actions. Example actions include changing operation modes, as well as Graphic User Interface (GUI) actions such as cursor movement, selection, menu navigation, and other functions. In some embodiments, processing system 110 provides information about the input (or lack of input) to some part of the electronic system (e.g., to a central processing system of the electronic system that is separate from processing system 110, if such a separate central processing system exists). In some embodiments, some part of the electronic system processes information received from processing system 110 to act on user input, such as to facilitate a full range of actions, including mode changing actions and GUI actions.

For example, in some embodiments, processing system 110 operates the sensing element(s) of input device 100 to produce electrical signals indicative of input (or lack of input) in sensing region 120. Processing system 110 may perform any appropriate amount of processing on the electrical signals in producing the information provided to the electronic system. For example, processing system 110 may digitize analog electrical signals obtained from the sensor electrodes. As another example, processing system 110 may perform filtering or other signal conditioning. As yet another example, processing system 110 may subtract or otherwise account for a baseline, such that the information reflects a difference between the electrical signals and the baseline. As yet further examples, processing system 110 may determine positional information, recognize inputs as commands, recognize handwriting, and the like.

"Positional information" as used herein broadly encompasses absolute position, relative position, velocity, acceleration, and other types of spatial information. As one example, "zero-dimensional" positional information includes near/far or contact/no contact information. As another example, "one-dimensional" positional information includes positions along an axis. As yet another example, "two-dimensional" positional information includes motions in a plane. As still another example, "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, input device 100 is implemented with additional input components that are operated by processing system 110 or by some other processing system. These additional input components may provide redundant functionality for input in sensing region 120, or some other functionality. FIG. 1 shows buttons 130 near sensing region 120 that can be used to facilitate selection of items using input device 100. Other types of additional input components include sliders, balls, wheels, switches, and the like. Conversely, in some embodiments, input device 100 may be implemented with no other input components.

In some embodiments, input device 100 may be a touch screen, and sensing region 120 overlaps at least part of an active area of a display screen. For example, input device 100 may comprise substantially transparent sensor electrodes overlaying the display screen and provide a touch screen interface for the associated electronic system 150. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. Input device 100 and the display screen may share physical elements. For example, some embodiments may utilize some of the same electrical components for displaying and sensing. As another example, the display screen may be operated in part or in total by processing system 110.

It should be understood that while many embodiments are described in the context of a fully functioning apparatus, the mechanisms are capable of being distributed as a program product (e.g., software) in a variety of forms. For example, the mechanisms that are described may be implemented and distributed as a software program on information bearing media that are readable by electronic processors (e.g., non-transitory computer-readable and/or recordable/writable information bearing media readable by processing system 110). Additionally, the embodiments apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other non-transitory storage technology.

Example Sensor Electrode Pattern

Figure 2:
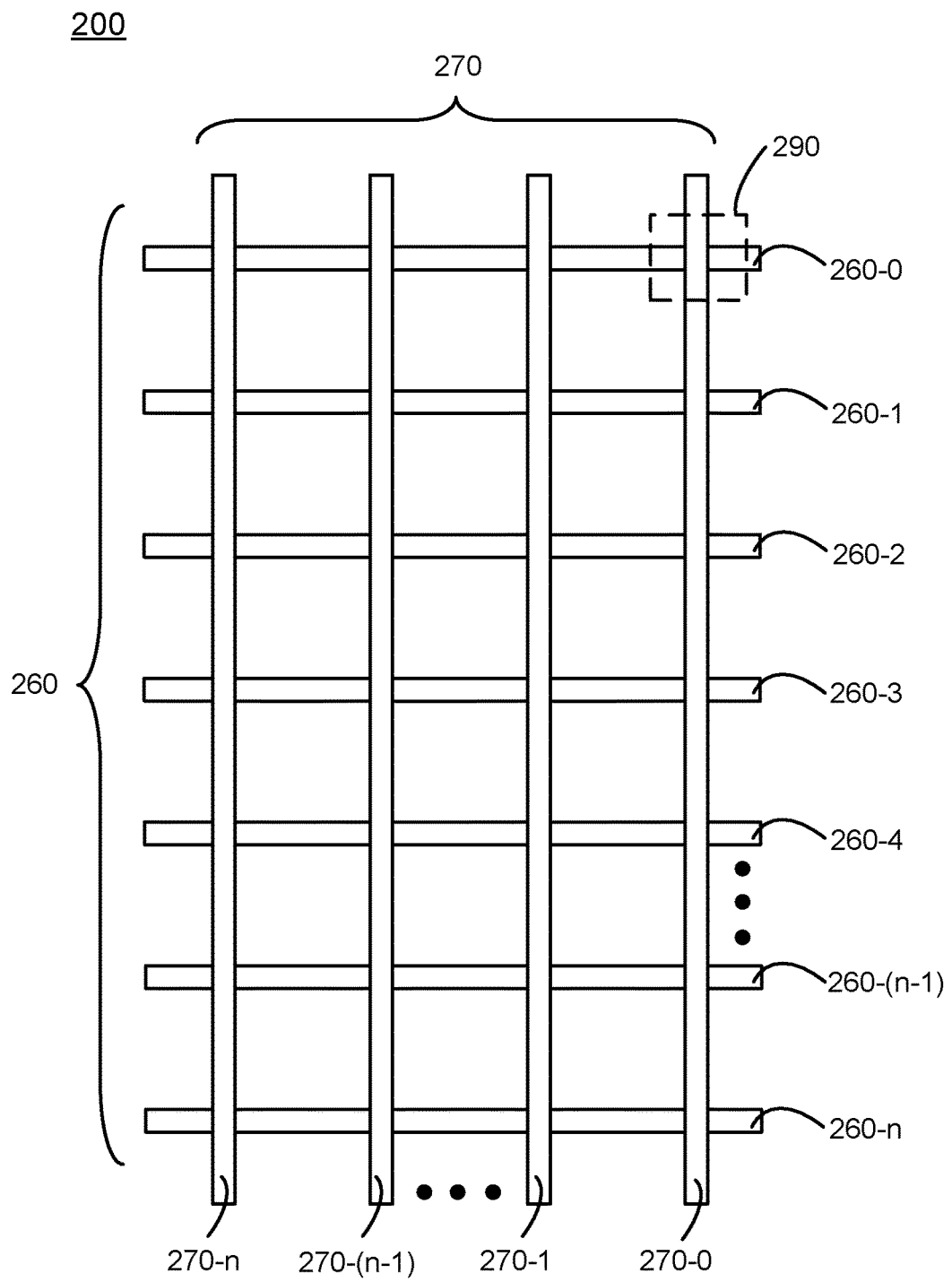
FIG. 2 shows a portion of an example sensor electrode pattern which may be utilized in a sensor to generate all or part of the sensing region of an input device, such as a touch screen, according to some embodiments.

FIG. 2 shows a portion of an example sensor electrode pattern 200 which may be utilized in a sensor to generate all or part of the sensing region of input device 100, according to various embodiments. Input device 100 is configured as a capacitive sensing input device when utilized with a capacitive sensor electrode pattern. For purposes of clarity of illustration and description, a non-limiting simple rectangular sensor electrode pattern 200 is illustrated. It is appreciated that numerous other sensor electrode patterns may be employed with the techniques described herein, including but not limited to: patterns with a single sensor electrode; patterns with a single set of sensor electrodes; patterns with two sets of sensor electrodes disposed in a single layer (without overlapping); patterns with two sets of sensor electrodes disposed in a single layer employing jumpers at crossover regions between sensor electrodes; patterns that utilize one or more display electrodes of a display device such as one or more segments of a common voltage ($V_{COM}$) electrode; patterns with one or more of source electrodes, gate electrodes, anode electrodes, and cathode electrodes; and patterns that provide individual button electrodes.

The illustrated sensor electrode pattern is made up of a first plurality of sensor electrodes 270 (270-0, 270-1 . . . 270-($n$-1), 270-$n$) and a second plurality of sensor electrodes 260 (260-0, 260-1, 260-2, 260-3, 260-4 . . . 260-($n$-1), 260-$n$) which overlay one another, in this example. In many embodiments, processing system 110 is configured to operate the second plurality of sensor electrodes 260 as transmitter electrodes by driving them with transmitter signals and the first plurality of sensor electrodes 270 as receiver electrodes by receiving resulting signals with them. Other embodiments, may reverse the roles of sensor electrodes 260 and 270. In the illustrated example, sensing pixels are centered at locations where transmitter and receiver electrodes cross. Capacitive pixel 290 illustrates one of the capacitive pixels generated by sensor electrode pattern 200 during transcapacitive sensing. It is appreciated that in a crossing sensor electrode pattern, such as the illustrated example, some form of insulating material or substrate is typically disposed between transmitter electrodes 260 and receiver electrodes 270. However, in some embodiments, transmitter electrodes 260 and receiver electrodes 270 may be disposed on the same layer as one another through use of routing techniques and/or jumpers. In various embodiments, touch sensing includes sensing input objects anywhere in sensing region 120 and may comprise: no contact with any surfaces of the input device 100, contact with an input surface (e.g., a touch surface) of the input device 100, contact with an input surface of the input device 100 coupled with some amount of applied force or pressure, and/or a combination thereof.

When accomplishing transcapacitive measurements, capacitive pixels, such as capacitive pixel 290, are areas of localized capacitive coupling between transmitter electrodes 260 and receiver electrodes 270 (e.g., between transmitter electrode 260-0 and receiver electrode 270-0). The capacitive coupling between transmitter electrodes 260 and receiver electrodes 270 changes with the proximity and motion of input objects in the sensing region associated with transmitter electrodes 260 and receiver electrodes 270.

In some embodiments, sensor electrode pattern 200 is "scanned" to determine these capacitive couplings. That is, the transmitter electrodes 260 are driven to transmit transmitter signals. Transmitters may be operated such that one transmitter electrode transmits at one time, or multiple transmitter electrodes transmit at the same time. Where multiple transmitter electrodes transmit simultaneously, these multiple transmitter electrodes may transmit the same transmitter signal and produce an effectively larger transmitter electrode, or these multiple transmitter electrodes may transmit different transmitter signals. For example, multiple transmitter electrodes may transmit different transmitter signals according to one or more coding schemes that enable their combined effects on the resulting signals of receiver electrodes 270 to be independently determined.

The receiver electrodes 270 may be operated singly or multiply to acquire resulting signals. The resulting signals may be used to determine measurements of the capacitive couplings at the capacitive pixels where transmitter electrodes 260 and receiver electrodes 270 cross or interact to measure a transcapacitance.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

In some embodiments, one or more sensor electrodes 260 or 270 may be operated to perform absolute capacitive sensing at a particular instance of time. For example, sensor electrode 270-0 may be charged and then the capacitance of sensor electrode 270-0 may be measured. In such an embodiment, an input object 140 interacting with sensor electrode 270-0 alters the electric field near sensor electrode 270-0, thus changing the measured capacitive coupling. In this same manner, a plurality of sensor electrodes 270 may be used to measure absolute capacitance and/or a plurality of sensor electrodes 260 may be used to measure absolute capacitance. It should be appreciated that when performing absolute capacitance measurements the labels of "receiver electrode" and "transmitter electrode" lose the significance that they have in transcapacitive measurement techniques, and instead a sensor electrode 260 or 270 may simply be referred to as a "sensor electrode" or may continue to use its designation as a transmitter electrode or a receiver electrode even though they are used in the same manner during absolute capacitive sensing.

Capacitive images and absolute capacitance measurements can be adjusted for the background capacitance of the sensor device for more efficient processing. For example, various techniques may be employed internal and/or external to an ASIC/processing system to subtract/offset some amount of the baseline capacitance that is known to be present in an absolute capacitive measurement. In absolute capacitive sensing, such charge offsetting improves the dynamic range of an amplifier of the ASIC/processing system that is used to amplify a signal which includes an input object related component on top of the baseline absolute capacitance signal measurement. This is because the component of the signal attributed to presence of an input object can be more greatly amplified (without amplifier saturation) if some of the baseline portion is removed by internal offsetting.

Many techniques for internal offset (internal to the ASIC/processing system) of a baseline charge are known in the art and include utilizing an offsetting capacitance in parallel with a feedback capacitor of the amplifier and/or injecting charge to an input of the amplifier that is also coupled with the sensor from which an absolute capacitance is being measured.

In some embodiments, using techniques herein, one or more portions of a printed circuit (e.g., a flexible printed circuit, a printed circuit board, a lithographically printed circuit, or other type of printed circuit) that includes routing traces used to couple sensing signals to and/or from sensors in a sensing region of a sensing device can be used to offset some amount of the baseline capacitance measured during absolute capacitive sensing. This type of charge offsetting is accomplished external to the ASIC/processing system. It should be appreciated that any of the external charge offsetting techniques described herein may be utilized alone or may be used in combination with one or more internal charge offsetting techniques.

Example Processing System

Figure 3:
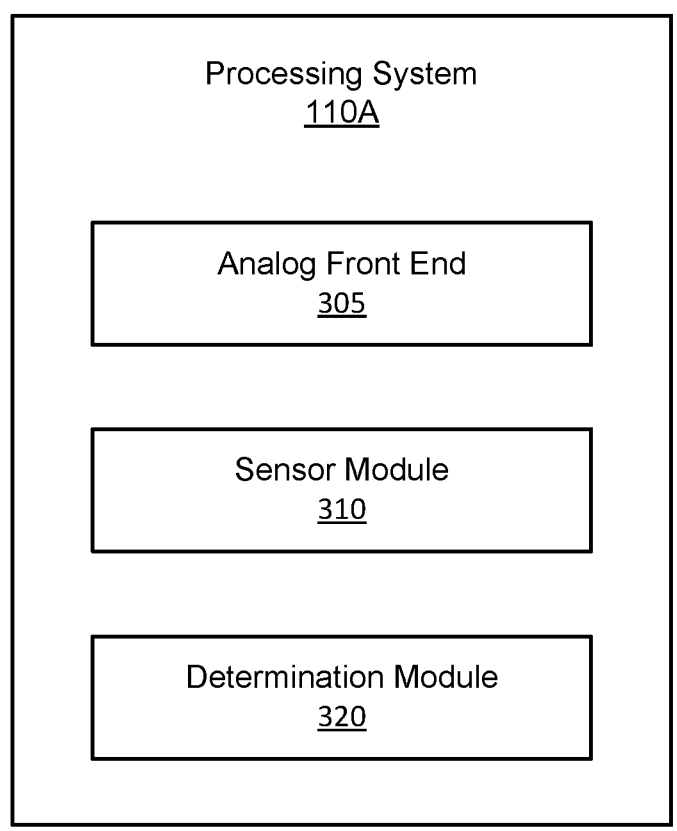
FIG. 3 illustrates a block diagram of some components of an example processing system that may be utilized with an input device, according to various embodiments.

FIG. 3 illustrates a block diagram of some components of an example processing system 110A that may be utilized with an input device (e.g., in place of processing system 110 as part of input device 100), according to various embodiments. As described herein, input device 110 is a capacitive sensing input device, however digital to analog convertors and analog to digital convertors described herein may be utilized with other types of input devices. Processing system 110A may be implemented with one or more Application Specific Integrated Circuits (ASICSs), one or more Integrated Circuits (ICs), one or more controllers, or some combination thereof. In one embodiment, processing system 110A is communicatively coupled with one or more transmitter electrode(s) and receiver electrode(s) that implement a sensing region 120 of an input device 100. In some embodiments, processing system 110A and the input device 100 of which it is a part may be disposed in or communicatively coupled with an electronic system 150, such as a display device, computer, or other electronic system.

In one embodiment, processing system 110A includes, among other components: an analog front end 305, a sensor module 310, and determination module 320. Processing system 110A and/or components thereof may be coupled with sensor electrodes of a sensor electrode pattern, such as sensor electrode pattern 200, among others. For example, sensor module 310 is coupled with one or more sensor electrodes (260, 270) of a sensor electrode pattern (e.g., sensor electrode pattern 200) of input device 100.

Analog front end 305 operates to perform front end signal processing by receiving an input from a capacitive sensor and performing front end processing of the input to achieve a front-end processed input. Analog front end 305 or other portion of processing system 100A may include circuits such as digital to analog convertors (401A, 401B, 501, 601A, 601B and the like described herein) and analog to digital convertors (800, 900, and the like described herein) that are used to initially process signals before the signals are presented to the sensor module 310 and/or determination module 320 for further processing. For example, such an analog to digital convertor may take a front-end processed signal as its input and conduct analog to digital processing upon it.

In various embodiments, sensor module 310 comprises sensor circuitry and operates to interact with the sensor electrodes, of a sensor electrode pattern, that are utilized to generate a sensing region 120. This includes operating a first plurality of sensor electrodes (e.g., sensor electrodes 260) to be silent, to be driven with a transmitter signal, to be used for transcapacitive sensing, and/or to be used for absolute capacitive sensing. This also includes operating a second plurality of sensor electrodes (e.g., sensor electrodes 270) to be silent, to be driven with a transmitter signal, to be used for transcapacitive sensing, and/or to be used for absolute capacitive sensing.

Sensor module 310 is configured to acquire transcapacitive resulting signals by transmitting with a first one of a plurality of sensor electrodes of the input device and receiving with a second one of the plurality of sensor electrodes. During transcapacitive sensing, sensor module 310 operates to drive (i.e., transmit) transmitter signals on one or more sensor electrodes of a first plurality of sensor electrodes (e.g., one or more of transmitter electrodes 260). A transmitter signal may be a square wave, trapezoidal wave, or some other waveform. In a given time interval, sensor module 310 may drive or not drive a transmitter signal (waveform) on one or more of the plurality of sensor electrodes. Sensor module 310 may also be utilized to couple one or more of the first plurality of sensor electrodes to high impedance, ground, or to a constant voltage when not driving a transmitter signal on such sensor electrodes. In some embodiments, when performing transcapacitive sensing, sensor module 310 drives two or more transmitter electrodes of a sensor electrode pattern at one time. When driving two or more sensor electrodes of a sensor electrode pattern at once, the transmitter signals may be coded according to a code. The code may be altered, such as lengthening or shortening the code. Sensor module 310 also operates to receive resulting signals, via a second plurality of sensor electrodes (e.g., one or more of receiver electrodes 270) during transcapacitive sensing. During transcapacitive sensing, received resulting signals correspond to and include effects corresponding to the transmitter signal(s) transmitted via the first plurality of sensor electrodes. These transmitted transmitter signals may be altered or changed in the resulting signal due to presence of an input object, stray capacitance, noise, interference, and/or circuit imperfections among other factors, and thus may differ slightly or greatly from their transmitted versions. It is appreciated that sensor module 310 may, in a similar fashion, transmit transmitter signals on one or more of sensor electrodes 270 and receive corresponding resulting signals on one or more of sensor electrodes 260.

In absolute capacitive sensing, a sensor electrode is both driven and used to receive a resulting signal that results from the signal driven on to the sensor electrode. In this manner, during absolute capacitive sensing, sensor module 310 operates to drive (i.e., transmit) a signal on to and receive a signal from one or more of sensor electrodes 260 or 270. During absolute capacitive sensing, the driven signal may be referred to as an absolute capacitive sensing signal, transmitter signal, or modulated signal, and it is driven through a routing trace that provides a communicative coupling between processing system 110A and the sensor electrode(s) with which absolute capacitive sensing is being conducted.

In various embodiments, sensor module 310 includes one or more amplifiers. Such an amplifier may be interchangeably referred to as an "amplifier," a "front-end amplifier," a "receiver," an "integrating amplifier," a "differential amplifier," or the like, and operates to receive a resulting signal at an input and provide an integrated voltage as an output. The resulting signal is from one or more sensor electrodes of a sensor electrode pattern, such as sensor electrode pattern 200. A single amplifier may be coupled with and used to receive a resulting signal from exclusively from a single sensor electrode, may receive signals from multiple sensor electrodes that are simultaneously coupled with the amplifier, or may receive signals from a plurality of sensor electrodes that are coupled one at a time to the amplifier. A sensor module 310 may include multiple amplifiers utilized in any of these manners. For example, in some embodiments, a first amplifier may be coupled with a first sensor electrode while a second amplifier is coupled with a second sensor electrode.

Determination module 320 may be implemented as hardware (e.g., hardware logic and/or other circuitry) and/or as a combination of hardware and instructions stored in a non-transitory manner in a computer readable storage medium.

Determination module 320 operates to compute/determine a measurement of a change in a transcapacitive coupling between a first and second sensor electrode during transcapacitive sensing. Determination module 320 then uses such measurements to determine the positional information comprising the position of an input object (if any) with respect to sensing region 120. The positional information can be determined from a transcapacitive image. The transcapacitive image is determined by determination module 320 based upon resulting signals acquired by sensor module 310. The resulting signals are used as or form capacitive pixels representative of input(s) relative to sensing region 120. It is appreciated that determination module 320 operates to decode and reassemble coded resulting signals to construct a transcapacitive image from a transcapacitive scan of a plurality of sensor electrodes.

In embodiments where absolute capacitive sensing is performed with sensor electrodes 260 and/or 270, determination module 320 also operates to compute/determine a measurement of absolute capacitive coupling to a sensor electrode. For example, determination module 320 operates to determine an absolute capacitance of the sensor electrode (e.g., sensor electrode 270-0) after a sensing signal has been driven on the sensor electrode. It should be noted that processing system 110A may, in some embodiments, compute an absolute capacitive image by combining (e.g., through multiplication, addition, or other means) absolute capacitive profiles measured along at least two different axes of a sensing region. With reference to FIG. 2 as an example, in some embodiments, determination module 320 creates an absolute capacitive image by combining a first absolute capacitive profile acquired with sensor electrodes 260 with a second absolute capacitive profile acquired with sensor electrodes 270. In other embodiments, determination module 320 may acquire an absolute capacitive image without the need for intermediate absolute capacitive profiles by acquiring a plurality of individual absolute capacitive measurements throughout the sensing region. Determination module 320 then uses such measurements to determine the positional information comprising the position of an input object (if any) with respect to sensing region 120. The positional information can be determined from, for example, an absolute capacitive image or from absolute capacitive profiles.

In some embodiments determination module 320 may utilize measurements (i.e., resulting signals) obtained from both absolute capacitive sensing and transcapacitive sensing (instead of using measurements from just one type of these types capacitive sensing) in determining a position of an input object relative to sensing region 120. This is sometimes referred to as hybrid capacitive sensing. Determination module 320 then uses such measurements to determine the positional information comprising the position of an input object (if any) with respect to sensing region 120. The positional information can be determined from a hybrid capacitive image.

In some embodiments, processing system 110A comprises decision making logic which directs one or more portions of processing system 110A, such as sensor module 310 and/or determination module 320, to operate in a selected one of a plurality of different operating modes based on various inputs.

Examples of Multiple Split Digital to Analog Convertors

Figure 4A:
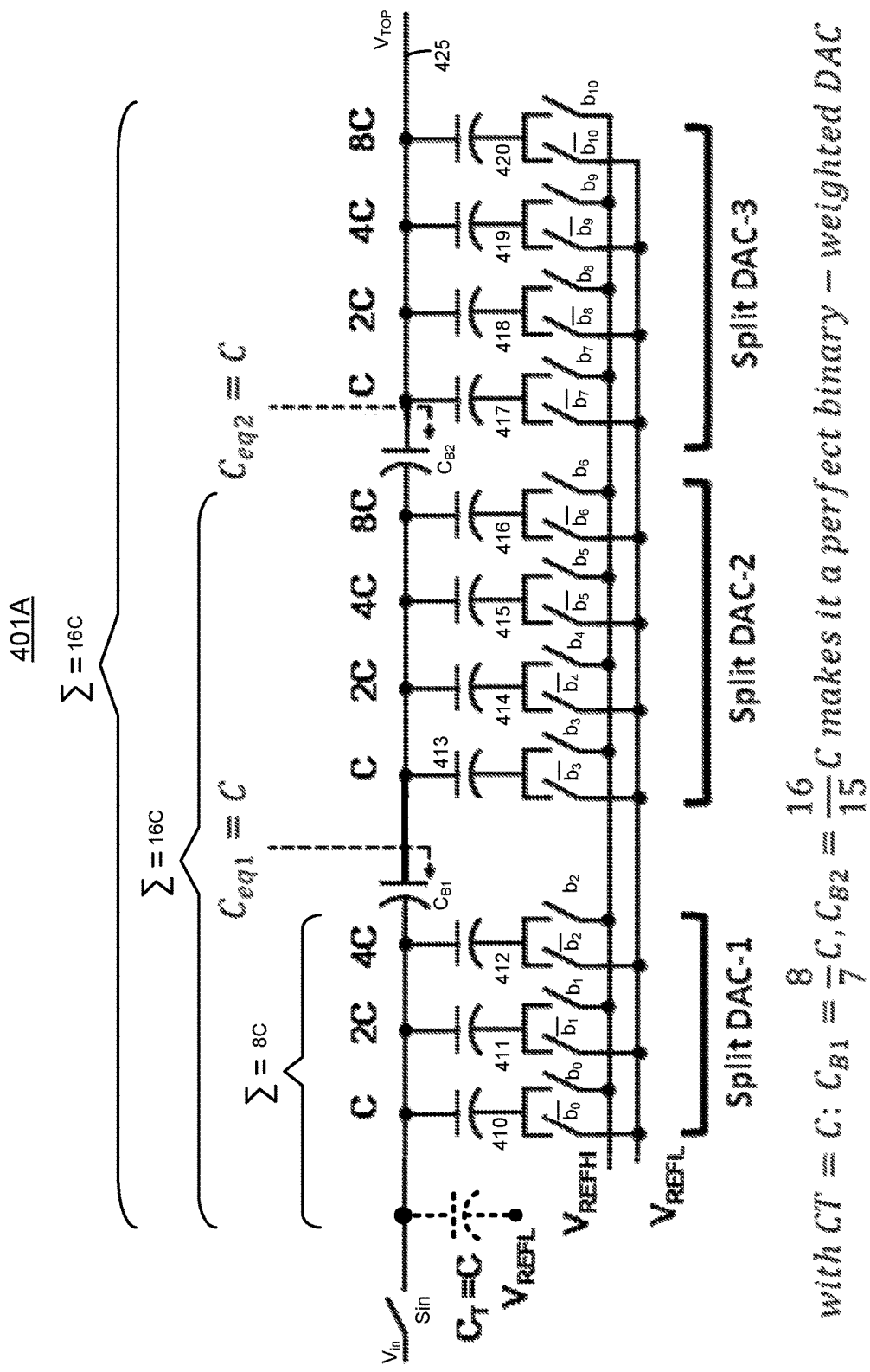
FIG. 4A illustrates a block diagram of a top plate sampling digital to analog convertor split into three portions, according to various embodiments.

FIG. 4A illustrates a block diagram of a top plate sampling digital to analog convertor (DAC) 401A split into three portions (split DAC-1, split DAC-2, and split DAC-3) by two bridge capacitors ($C_{B1}$ and $C_{B2}$), according to various embodiments. DAC 401A includes an output line 425. By "multiple split" what is meant herein is that an overall DAC circuit includes at least two bridge capacitors which split the overall DAC into at least three split DACs. A first plurality of capacitors (410, 411, and 412, which comprise the capacitors of split DAC-1) have their top plates coupled in parallel and this plurality of capacitors includes a Least Significant Bit (LSB, $b_0$) capacitor, 410, with a first capacitance value of C. A second plurality of capacitors (413, 414, and 415, and 416, which comprise the capacitors of split DAC-2) have their top plates coupled in parallel with one another and this plurality of capacitors includes a capacitor, 413, with a capacitance value of C but which has a weight equal to $2^3=8$ of that of the capacitor C for $b_0$. A third plurality of capacitors (417, 418, 419, and 420), which comprise the capacitors of split DAC-3) have their top plates coupled in parallel with one another and this plurality of capacitors includes a capacitor, 417, with a capacitance value of C but which has a weight equal to $2^7$ times of that of the LSB cap for $b_0$. The value of each of capacitors 410, 413, and 417 is C; the value of each of capacitors 411, 414, and 418 is 2 C; the value of each of capacitors 412, 415, and 419 is 4 C; and the value of each of capacitors 416 and 420 is 8 C.

Switch logic (not shown) controls the positioning of switches b0 through b10 and $\overline{b0}$ through $\overline{b10}$. Switches b0 and $\overline{b0}$ couple the bottom plate of capacitor 410 respectively to high reference voltage ($V_{REFH}$) and a low reference voltage ($V_{REFL}$). Switches b1 and $\overline{b1}$ couple the bottom plate of capacitor 411 respectively to $V_{REFH}$ and $V_{REFL}$. Switches b2 and $\overline{b2}$ couple the bottom plate of capacitor 412 respectively to $V_{REFH}$ and $V_{REFL}$. Switches b3 and $\overline{b3}$ couple the bottom plate of capacitor 413 respectively to $V_{REFH}$ and $V_{REFL}$. Switches b4 and $\overline{b4}$ couple the bottom plate of capacitor 414 respectively to $V_{REFH}$ and $V_{REFL}$. Switches b5 and $\overline{b5}$ couple the bottom plate of capacitor 415 respectively to $V_{REFH}$ and $V_{REFL}$. Switches b6 and $\overline{b6}$ couple the bottom plate of capacitor 416 respectively to $V_{REFH}$ and $V_{REFL}$. Switches b7 and $\overline{b7}$ couple the bottom plate of capacitor 417 respectively to $V_{REFH}$ and $V_{REFL}$. Switches b8 and $\overline{b8}$ couple the bottom plate of capacitor 418 respectively to $V_{REFH}$ and $V_{REFL}$. Switches b9 and $\overline{b9}$ couple the bottom plate of capacitor 419 respectively to $V_{REFH}$ and $V_{REFL}$. Switches b10 and $\overline{b10}$ couple the bottom plate of capacitor 420 respectively to $V_{REFH}$ and $V_{REFL}$.

A first bridge capacitor $C_{B1}$ located in series on output line 425 bridges output line 425 between the first plurality of capacitors and the second plurality of capacitors. In particular, a first plate of bridge capacitor $C_{B1}$ is coupled to the top plate of capacitor 412 while a second plate of capacitor $C_{B1}$ is coupled to the top plate of capacitor 413. A second bridge capacitor $C_{B2}$ located in series on output line 425 bridges output line 425 between the second plurality of capacitors and the third plurality of capacitors. In particular, a first plate of bridge capacitor $C_{B2}$ is coupled to the top plate of capacitor 416 while a second plate of capacitor $C_{B2}$ is coupled to the top plate of capacitor 417. As will be discussed further herein, the values of $C_{B1}$ and $C_{B2}$ are selected to be different from one another.

In some embodiments a first analog trim capacitor $C_E$ is disposed between $C_{B1}$ and capacitor 413 such that its top plate is coupled with the top plate of the first bridge capacitor $C_{B1}$ and the top plate of capacitor 413, while the bottom plate of $C_E$ is coupled with a low reference voltage $V_{REFL}$. Though not shown here, a second trim capacitor can be used in parallel with the split DAC-1 to set the equivalent capacitor $C_{eq1}$ (in FIG. 4A/4B) to its desired value.

In some embodiments, as is illustrated in FIG. 4A, a terminating capacitor CT with a capacitance value of C has its top plate coupled to output line 425 in parallel with the first plurality of capacitors. Terminating capacitor CT is disposed between a switch $S_{IN}$ that switches an input voltage, $V_{IN}$. The first, second and third pluralities of capacitors are configured to sample voltage $V_{IN}$ in top plate sampling configuration.

In order to get perfectly binary weighted cap sizes, a unit size terminating capacitor, CT=C (unit size of the LSB capacitor) is used in some embodiments. Equation 1 is utilized to determine the capacitance assigned to $C_{B1}$.

$$C_{B1} = \frac{\Sigma \text{ all the capacitors to the left of } CB1 \text{ includig } CT}{\Sigma \text{ of all capacitors to the left of } CB1 \text{ excluding } CT} = \frac{8}{7}C \qquad \text{EQ. 1}$$

$$C_{B2} = \frac{\Sigma \text{ all the capacitors to the left of } CB2 \text{ includig } C_{eq1}}{\Sigma \text{ of all capacitors to the left of } CB2 \text{ excluding } C_{eq1}} = \frac{16}{15}C \qquad \text{EQ. 2}$$

Figure 4B:
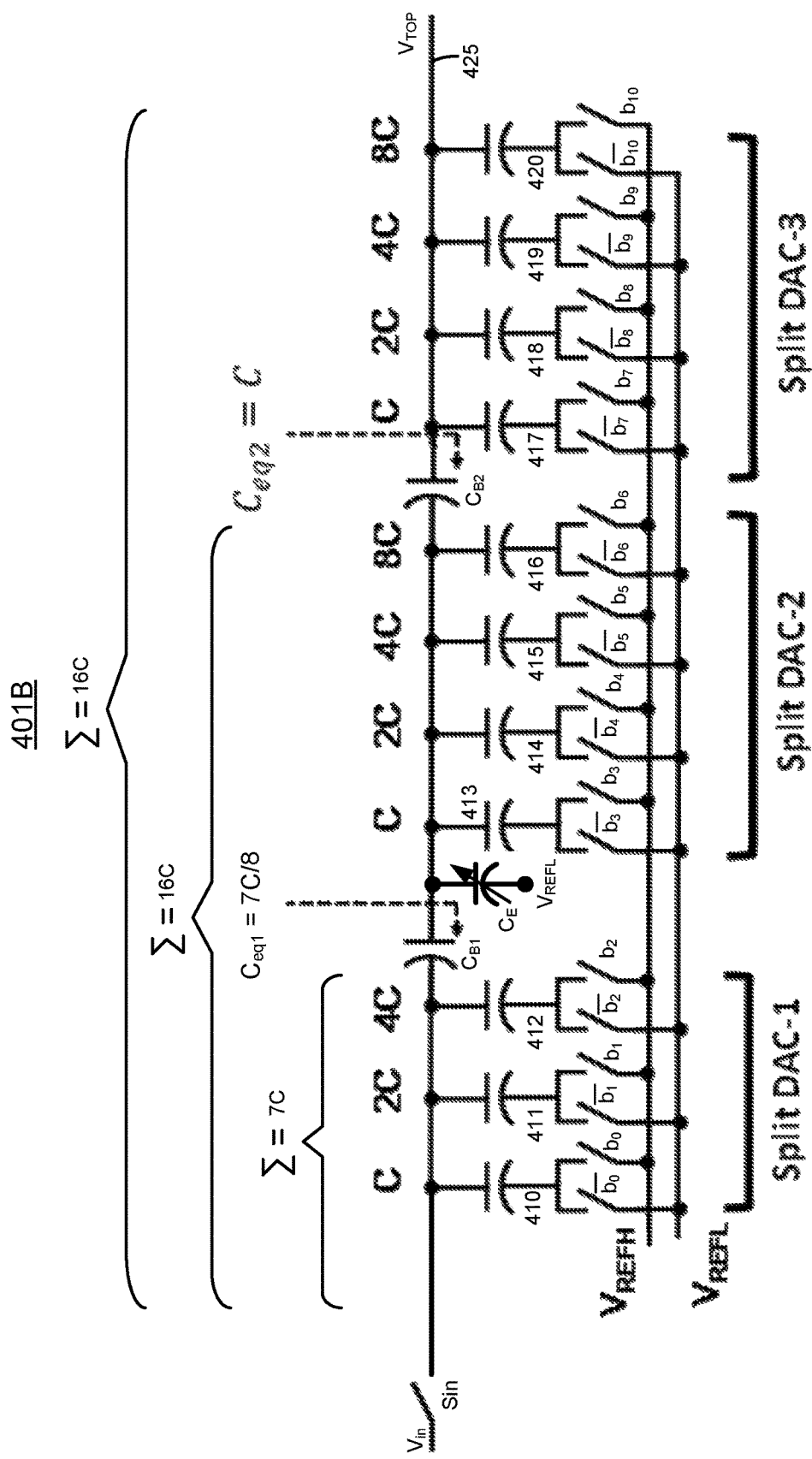
FIG. 4B illustrates a block diagram of a top plate sampling digital to analog convertor split into three portions, according to various embodiments.

Selection of $C_{B1}$ according to Equation 1 results in an equivalent capacitor, $C_{eq1}$ that has a capacitance value of C and is composed effectively of two series capacitances ($C_{B1}$ is the first capacitance and all the capacitors to the left of $C_{B1}$ compose the second capacitance). Selection of $C_{B2}$ according to Equation 2 results in an equivalent capacitor, $C_{eq2}$ that has a capacitance value of C and is composed effectively of two series capacitances ($C_{B2}$ is the first capacitance and all the capacitors to the left of $C_{B2}$ compose the second series capacitance). As a result, an Analog to digital convertor (ADC), see FIG. 7 and FIG. 8 for example, built with such a DAC will also be linear. If the sizes of the bridge capacitors, $C_{B1}$ and $C_{B2}$, deviate from the expected values then the DAC will not be linear and it will introduce errors called DNL (Differential Non-Linearity) and INL (Integral Non-Linearity). In a real integrated circuit, it is almost impossible to get a perfect weight of 8 C/7 on $C_{B1}$ and 16 C/15 on $C_{B2}$ due to mismatches and parasitic capacitances. As a result, some kind of tuning can be utilized, in some embodiments, to tune $C_{B1}$ closer to 8 C/7, to tune $C_{B2}$ closer to 16 C/15, or to tune both $C_{B1}$ and $C_{B2}$ such that overall the ADC linearity is within the target spec. In FIG. 4B, a tuning capacitor, $C_E$, is shown (located between $C_{B1}$ and capacitor 413) and is used to tune $C_{B2}$ from mismatches and parasitic to set $C_{eq2}$ to the closest to its desired value. A trim capacitor could similarly be placed in, between $C_{B1}$ and capacitor 412 to tune $C_{B1}$ to set $C_{eq1}$ to the closest to its desired value. The trim capacitor(s) may be built with a smaller and simpler capacitive DAC, however for simplicity of illustration and explanation trim capacitor $C_E$ is illustrated herein as a simple capacitor.

FIG. 4B illustrates a block diagram of a top plate sampling digital to analog convertor (DAC) 401B split into three portions (split DAC-1, split DAC-2, and split DAC-3) by two bridge capacitors ($C_{B1}$ and $C_{B2}$), according to various embodiments. DAC 401B includes an output line 425. Tuning both $C_{B1}$ and $C_{B2}$ can be a challenge. To alleviate this challenge, in some embodiments the DAC of FIG. 4A is realized without a $C_T$ and with a tuning capacitor $C_E$. In such an embodiment, as is illustrated in FIG. 4B, with $C_{B1}$=C, $C_{B2}$=16 C/15. To achieve $C_{eq2}$=C a tunable capacitor $C_E$ is used and the size is $C_E$ is determined as follows based on Equations 3 and 4.

With no $C_T$ and $C_{B1}$=C:

$$C_{eq1} = (C + 2c + 4c) \text{ in series with } C_{B1} \text{ which is } C = \frac{7}{8}C \qquad \text{EQ. 3}$$

$$C_{eq2} = \left(\frac{7}{8}C + C_E + C + 2C + 4C + 8C\right) \text{ in series with } C_{B2} \qquad \text{EQ. 4}$$

$$\text{which is } \frac{16}{15}C = \frac{\frac{16}{15}C\left(C_E + \frac{7}{8}C + 15C\right)}{\frac{16}{15}C + C_E + \frac{7}{8}C + 15C} = C \text{ expected}$$

Which can be simplified as, $$\frac{16C(8C_E + 127C)}{(120C_E + 2033C)} = C;$$

$$128C_E + 2032C = 120C_E + 2033C$$

Which yields, $$C_E = \frac{C}{8}$$

Thus with $C_E=C/8$, $C_{B1}=C$, and $C_{B2}=16\,C/15$ a DAC is achieved which is not quite binary weighted meaning each cap weight is not a factor of some exact multiplier of 2, but behaves in a linear fashion.

Figure 5:
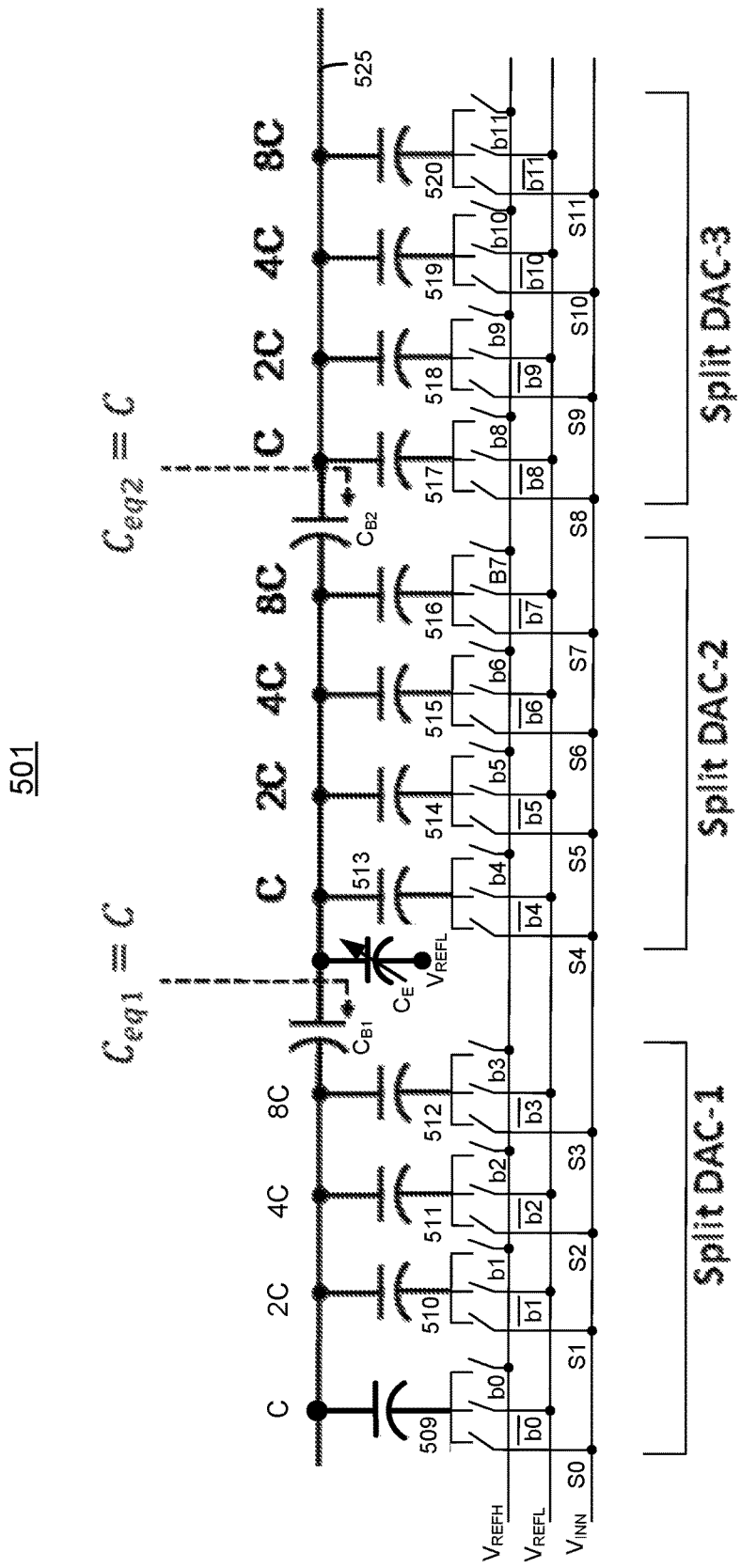
FIG. 5 illustrates a block diagram of a bottom plate sampling digital to analog convertor split into three portions, according to various embodiments.

FIG. 5 illustrates a block diagram of a bottom plate sampling digital to analog convertor 501 split into three portions (split DAC-1, split DAC-2, and split DAC-3) by two bridge capacitors ($C_{B1}$ and $C_{B2}$) according to various embodiments.

DAC 501 includes an output line 525. A first plurality of capacitors (509, 510, 511, and 512, which comprise the capacitors of split DAC-1) have their top plates coupled in parallel and this plurality of capacitors includes a least significant bit capacitor, 509, with a first capacitance value of C. A second plurality of capacitors (513, 514, and 515, and 516, which comprise the capacitors of split DAC-2) have their top plates coupled in parallel with one another and this plurality of capacitors includes a smallest capacitor, 513, with a capacitance value of C. A third plurality of capacitors (517, 518, 519, and 520, which comprise the capacitors of split DAC-3) have their top plates coupled in parallel with one another and this plurality of capacitors includes a smallest capacitor, 517, with a capacitance value of C. The value of each of capacitors 509, 513, and 513 is C; the value of each of capacitors 510, 514, and 518 is 2 C; the value of each of capacitors 511, 515, and 519 is 4 C; and the value of capacitors 512, 516, and 520 is 8 C.

Switch logic (not shown) controls the positioning of switches s0 thorough S11, b0 through b11 and $\overline{b0}$ through $\overline{b11}$. Switches s0, b0, and $\overline{b0}$ couple the bottom plate of capacitor 509 respectively to an input voltage Vinn, a high reference voltage ($V_{REFH}$), and a low reference voltage ($V_{REFL}$). Switches s0, b1, and $\overline{b1}$ couple the bottom plate of capacitor 510 respectively to, Vinn, $V_{REFH}$, and $V_{REFL}$. Switches s2, b2, and $\overline{b2}$ couple the bottom plate of capacitor 511 respectively to Vinn, $V_{REFH}$, and $V_{REFL}$. Switches s0, b3, and $\overline{b3}$ couple the bottom plate of capacitor 512 respectively to Vinn, $V_{REFH}$, and $V_{REFL}$. Switches s4, b4, and $\overline{b4}$ couple the bottom plate of capacitor 513 respectively to Vinn, $V_{REFH}$, and $V_{REFL}$. Switches s5, b5, and $\overline{b5}$ couple the bottom plate of capacitor 514 respectively to Vinn, $V_{REFH}$, and $V_{REFL}$ Switches s6, b6, and $\overline{b6}$ couple the bottom plate of capacitor 515 respectively to Vinn, $V_{REFH}$, and $V_{REFL}$. Switches s7, b7, and $\overline{b7}$ couple the bottom plate of capacitor 516 respectively to Vinn, $V_{REFH}$, and $V_{REFL}$. Switches s8, b8 and $\overline{b8}$ couple the bottom plate of capacitor 517 respectively to Vin, $V_{REFH}$, and $V_{REFL}$. Switches s9, b9, and $\overline{b9}$ couple the bottom plate of capacitor 518 respectively to Vinn, $V_{REFH}$, and $V_{REFL}$. Switches s10, b10, and $\overline{b10}$ couple the bottom plate of capacitor 519 respectively to Vinn, $V_{REFH}$, and $V_{REFL}$. Switches s11, b11, and $\overline{b11}$ couple the bottom plate of capacitor 520 respectively to Vinn, $V_{REFH}$, and $V_{REFL}$.

A first bridge capacitor $C_{B1}$ located in series on output line 525 bridges output line 525 between the first plurality of capacitors and the second plurality of capacitors. In particular, a first plate of bridge capacitor $C_{B1}$ is coupled to the top plate of capacitor 512 while a second plate of capacitor $C_{B1}$ is coupled to the top plate of capacitor 513. A second bridge capacitor $C_{B2}$ located in series on output line 525 bridges output line 525 between the second plurality of capacitors and the third plurality of capacitors. In particular, a first plate of bridge capacitor $C_{B2}$ is coupled to the top plate of capacitor 516 while a second plate of capacitor $C_{B2}$ is coupled to the top plate of capacitor 517. Based on the equations previously discussed, it can be seen that the values of $C_{B1}$ and $C_{B2}$ are selected to be different from one another.

In some embodiments a first analog trim capacitor $C_E$ is disposed between $C_{B1}$ and capacitor 513 such that its top plate is coupled with the top plate of the first bridge capacitor $C_{B1}$ and the top plate of capacitor 513, while the bottom plate of $C_E$ is coupled with a low reference voltage $V_{REFL}$. Though not shown here, a second trim capacitor can be used in parallel with the split DAC-1 to set the equivalent capacitor $C_{eq1}$ (in FIG. 4B) to its desired value. The trim capacitor(s) may be built with a smaller and simpler capacitive DAC, however for simplicity of illustration and explanation trim capacitor $C_E$ is illustrated herein as a simple capacitor.

In FIG. 5, a terminating capacitor CT is not utilized. However in some embodiments, a terminating capacitor CT with a capacitance value of C has its top plate coupled to output line 525 in parallel with the first plurality of capacitors. Terminating capacitor CT, when used, is disposed to the left of capacitor 509. The first, second and third pluralities of capacitors are configured to sample voltage Vinn from on their bottom plates in a bottom plate sampling configuration.

Figure 8:
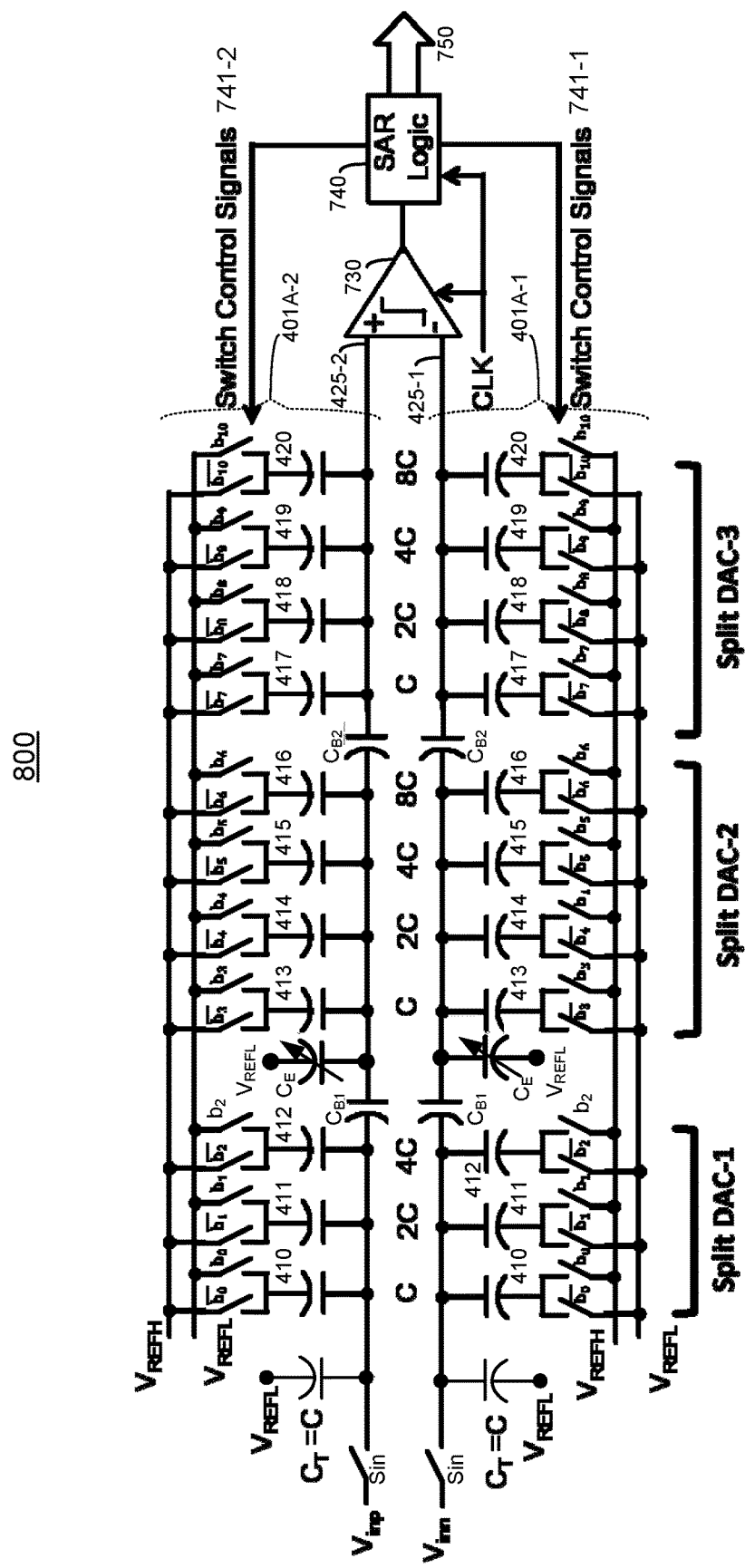
FIG. 8 illustrates a block diagram of a successive approximation register analog to digital convertor implemented with multiple split digital to analog convertors, according to various embodiments.

It should be appreciated from the depiction and description of FIG. 5 that any of the top plate sampling configurations of a DAC depicted herein can be arranged as a bottom plate sampling configuration. The difference is, as depicted in FIG. 8, in a top plate sampling 12-bit fully-differential SAR ADC each DAC (of FIG. 4B) requires 11 capacitors. Because in such configuration of top plate sampling the Most Significant Bit (MSB) is decided during sampling of the differential inputs $V_{inp}$ and $V_{inn}$. Thus in a top plate sampling scheme, where the ADC is fully differential, the total number of capacitors can be one less than the number of bits. The same is not possible with bottom plate sampling. Thus bottom plate sampling scheme requires exact number of capacitors; meaning for an n-bit ADC the DAC has to have a total n number of capacitors.

Figure 6A:
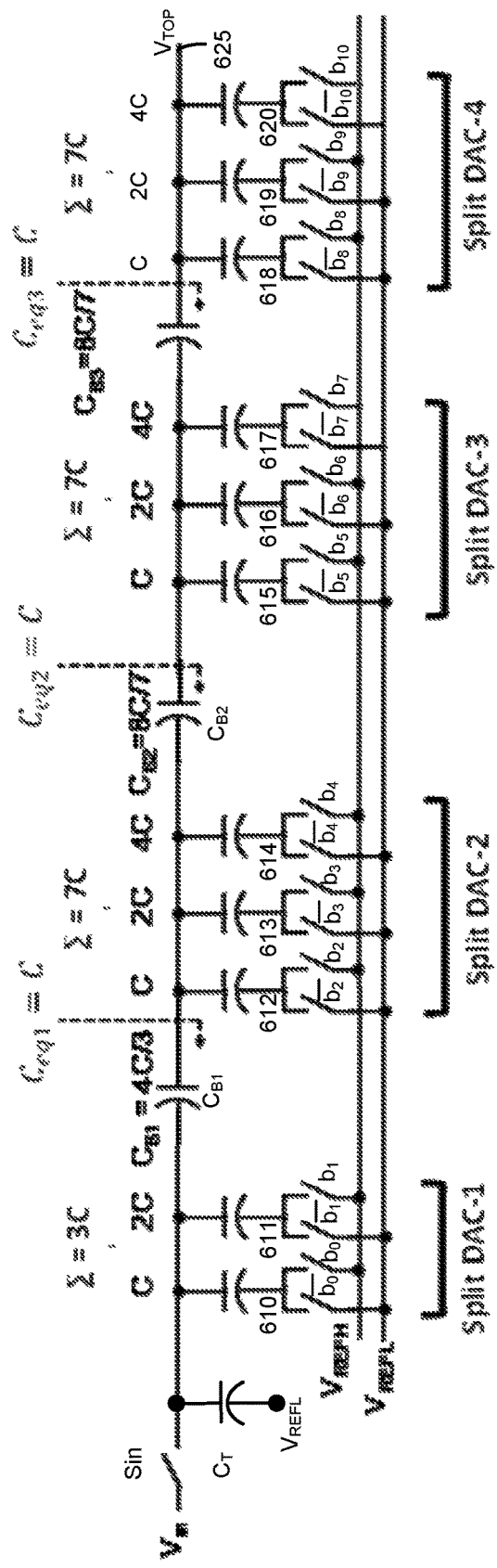
FIG. 6A illustrates a block diagram of a top plate sampling digital to analog convertor split into three portions, according to various embodiments.

FIG. 6A illustrates a block diagram of a top plate sampling digital to analog convertor 601A split into four portions (split DAC-1, split DAC-2, split DAC-3, and split DAC-4) by three bridge capacitors ($C_{B1}$, $C_{B2}$, and $C_{B3}$), according to various embodiments. A first plurality of capacitors (610 and 611 which comprise the capacitors of split DAC-1) have their top plates coupled in parallel and this plurality of capacitors includes a least significant bit capacitor, 610, with a first capacitance value of C. A second plurality of capacitors (612, 613, and 614, which comprise the capacitors of split DAC-2) have their top plates coupled in parallel with one another and this plurality of capacitors includes a smallest capacitor, 612, with a capacitance value of C. A third plurality of capacitors (615, 616, and 617, which comprise the capacitors of split DAC-3) have their top plates coupled in parallel with one another and this plurality of capacitors includes a smallest capacitor, 615, with a capacitance value of C. A fourth plurality of capacitors (618, 619, and 620, which comprise the capacitors of split DAC-4) have their top plates coupled in parallel with one another and this plurality of capacitors includes a smallest capacitor, 618, with a capacitance value of C. The value of each of capacitors 610, 612, 615, and 618 is C; the value of each of capacitors 611, 613, 616, and 619 is 2 C; the value of each of capacitors 614, 617, and 620 is 4 C. DAC 601 has the same number of bits as DACs 401 and 501 but utilizes a biggest unit capacitance value of 4 C instead of 8C as in DACs 401 and 501, thus reducing energy requirements, reducing size requirements on an integrated circuit for its capacitors, reducing switch size requirements for switching signals onto the capacitors, and increasing speed (due to reduced charging time of the smaller capacitors).

Switch logic (not shown) controls the positioning of switches b0 through b10 and $\overline{b0}$ through $\overline{b10}$. Switches b0 and $\overline{b0}$ couple the bottom plate of capacitor 610 respectively to high reference voltage ($V_{REFH}$) and a low reference voltage ($V_{REFL}$). Switches b1 and $\overline{b1}$ couple the bottom plate of capacitor 611 respectively to $V_{REFH}$ and $V_{REFL}$. Switches b2 and $\overline{b2}$ couple the bottom plate of capacitor 612 respectively to $V_{REFH}$ and $V_{REFL}$. Switches b3 and $\overline{b3}$ couple the bottom plate of capacitor 613 respectively to $V_{REFH}$ and $V_{REFL}$. Switches b4 and $\overline{b4}$ couple the bottom plate of capacitor 614 respectively to $V_{REFH}$ and $V_{REFL}$. Switches b5 and $\overline{b5}$ couple the bottom plate of capacitor 615 respectively to $V_{REFH}$ and $V_{REFL}$. Switches b6 and $\overline{b6}$ couple the bottom plate of capacitor 616 respectively to $V_{REFH}$ and $V_{REFL}$. Switches b7 and $\overline{b7}$ couple the bottom plate of capacitor 617 respectively to $V_{REFH}$ and $V_{REFL}$. Switches b8 and $\overline{b8}$ couple the bottom plate of capacitor 618 respectively to $V_{REFH}$ and $V_{REFL}$. Switches b9 and $\overline{b9}$ couple the bottom plate of capacitor 619 respectively to $V_{REFH}$ and $V_{REFL}$. Switches b10 and $\overline{b10}$ couple the bottom plate of capacitor 620 respectively to $V_{REFH}$ and $V_{REFL}$.

A first bridge capacitor $C_{B1}$ located in series on output line 625 bridges output line 625 between the first plurality of capacitors and the second plurality of capacitors. In particular, a first plate of bridge capacitor $C_{B1}$ is coupled to the top plate of capacitor 611 while a second plate of capacitor $C_{B1}$ is coupled to the top plate of capacitor 612. A second bridge capacitor $C_{B2}$ located in series on output line 625 bridges output line 625 between the second plurality of capacitors and the third plurality of capacitors. In particular, a first plate of bridge capacitor $C_{B2}$ is coupled to the top plate of capacitor 614 while a second plate of capacitor $C_{B2}$ is coupled to the top plate of capacitor 615. A third bridge capacitor $C_{B3}$ located in series on output line 625 bridges output line 625 between the third plurality of capacitors and the fourth plurality of capacitors. In particular, a first plate of bridge capacitor $C_{B3}$ is coupled to the top plate of capacitor 617 while a second plate of capacitor $C_{B3}$ is coupled to the top plate of capacitor 618. The values of $C_{B1}$, $C_{B2}$, and $C_{B3}$ are selected to be different from one another. For example, in FIG. 6A, $C_{B1}$, $C_{B2}$, and $C_{B3}$ are selected using equations 4, 5, and 6 which are shown below.

$$C_{B1} = \frac{\Sigma \text{ all the capacitors to the left of } C_{B1} \text{ including } C_T}{\Sigma \text{ of all capacitors to the left of } C_{B1} \text{ excluding } C_T} \qquad \text{EQ. 4}$$

$$C_{B2} = \frac{\Sigma \text{ all the capacitors to the left of } C_{B2} \text{ including } C_{eq1}}{\Sigma \text{ of all capacitors to the left of } C_{B1} \text{ excluding } C_{eq1}} \qquad \text{EQ. 5}$$

$$C_{B2} = \frac{\Sigma \text{ all the capacitors to the left of } C_{B2} \text{ including } C_{eq2}}{\Sigma \text{ of all capacitors to the left of } C_{B1} \text{ excluding } C_{eq2}} \qquad \text{EQ. 6}$$

In some embodiments, as illustrated in FIG. 6A, a terminating capacitor CT with a capacitance value of C in parallel with the first plurality of capacitors is used. Terminating capacitor CT is disposed between a switch $S_{in}$ that switches an input voltage, $V_{IN}$, onto output line 625. The first, second and third pluralities of capacitors are configured to sample voltage Vin from output line 625 in top plate sampling configuration. Though not shown here, like in FIG. 5, the DAC in FIG. 6A can be configured to sample the input $V_{IN}$ at the bottom plates of the DAC.

Figure 6B:
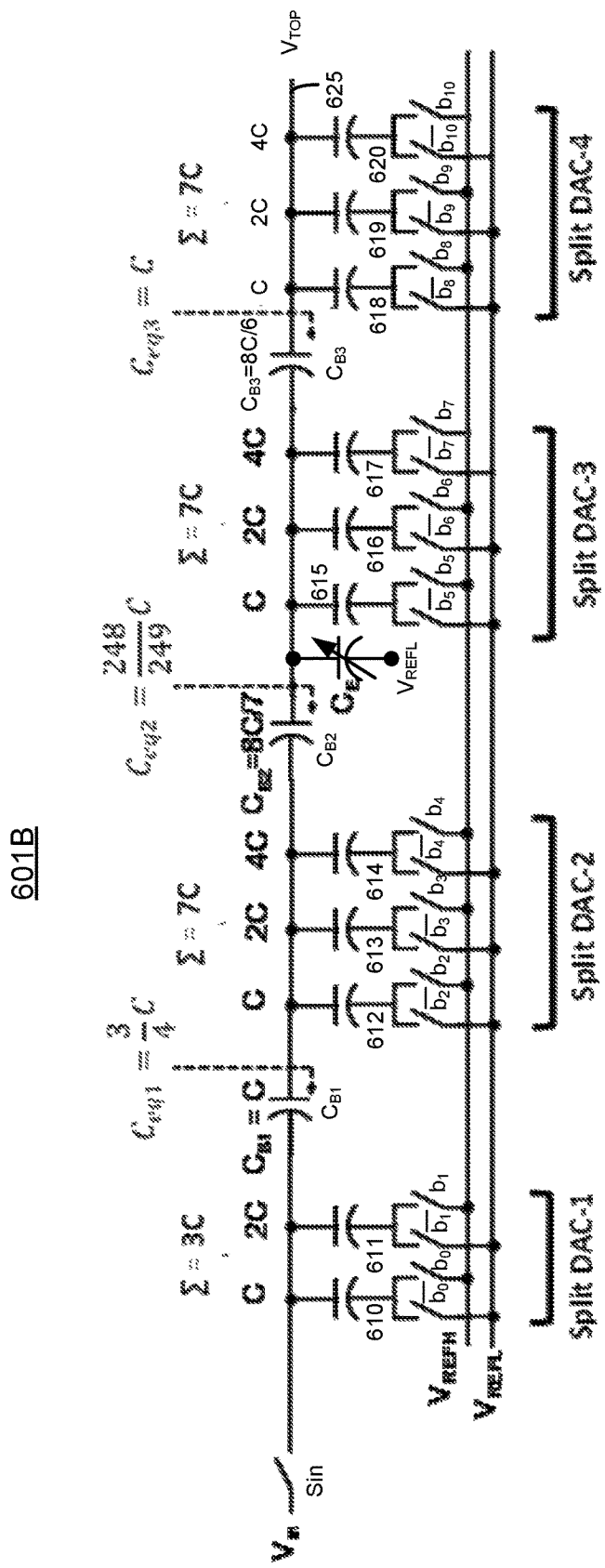
FIG. 6B illustrates a block diagram of a top plate sampling digital to analog convertor split into three portions, according to various embodiments.

FIG. 6B illustrates a block diagram of a top plate sampling digital to analog convertor 601B split into four portions (split DAC-1, split DAC-2, split DAC-3, and split DAC-4) by three bridge capacitors ($C_{B1}$, $C_{B2}$, and $C_{B3}$), according to various embodiments. Though not shown here, like in FIG. 5, the DAC in FIG. 6B can be configured to sample the input $V_{IN}$ at the bottom plates of the DAC. The difference between FIG. 6A and FIG. 6B is that $C_{B1}$ has a different value in FIGS. 6A and 6B, the terminating capacitor CT illustrated in FIG. 6A is absent in FIG. 6B, and an analog trim capacitor $C_E$ is disposed between $C_{B2}$ and capacitor 615 such that its top plate is coupled with the top plate of the second bridge capacitor $C_{B2}$ and with the top plate of capacitor 615, while the bottom plate of $C_E$ is coupled with a low reference voltage $V_{REFL}$.

Following the same mathematical procedure outlined above with respect to FIG. 4A, $C_{eq1}$ and $C_{eq2}$ for DAC 601A can be determined as follows:

$$C_{eq1} = \frac{3}{4}C$$

$$C_{eq2} = \frac{248}{249}C$$

And in order to get $C_{eq3}$=C, a tunable capacitor, $C_E$, with default settings $$\frac{C}{249}$$

is needed. Thus the tunable capacitor, $C_E$, in this case tends to be very small. Though not shown here, additional trim capacitors can be used to set the equivalent capacitor $C_{eq1}$ and $C_{eq2}$ (in FIG. 6B) to their desired values. The trim capacitor(s) may be built with smaller and simpler capacitive DACs, however for simplicity of illustration and explanation trim capacitor $C_E$ is illustrated herein as a simple capacitor.

It should be appreciated that $C_{B2}$ and $C_{B3}$ must match very closely. The matching of the bridge capacitors becomes more challenging as the DAC is split into more split DACs. As a result, embodiments with more than four split DACs may require more additional tunable capacitors. Limits may also be reached where it may be not be possible actually implement a DAC that is split into smaller split DACS if the manufacturing process cannot guarantee a high level of matching requirements and precision required by the design.

Figure 7:
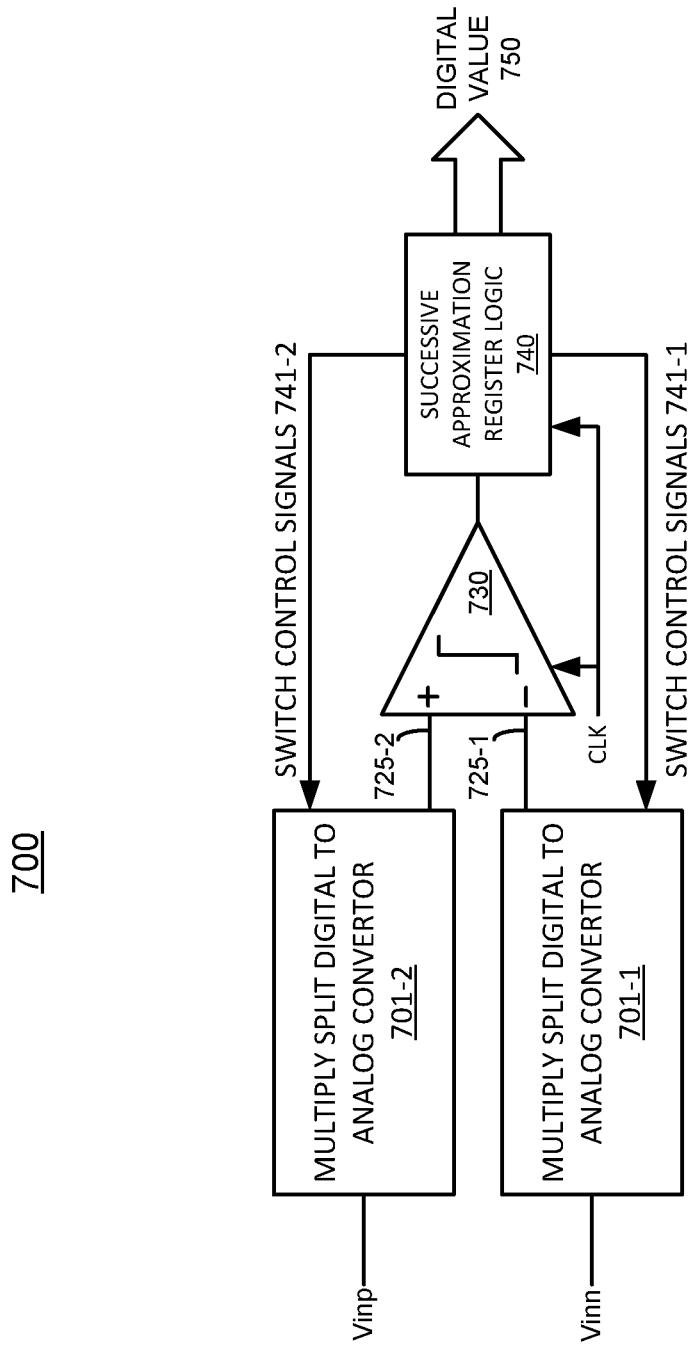
FIG. 7 illustrates a block diagram of a successive approximation register analog to digital convertor implemented with multiple split digital to analog convertors, according to various embodiments.

Example Successive Approximation Register Analog to Digital Convertors with Multiple Split Digital to Analog Convertors FIG. 7 illustrates a block diagram of a successive approximation register (SAR) analog to digital convertor (ADC) 700 implemented with multiple split digital to analog convertors (701-1, 701-2), according to various embodiments. SAR ADC 700 includes two multiple split DACs 701-1 and 701-2, a comparator 730, and successive approximation register (SAR) logic 740. A clock signal is utilized to synchronize operations of comparator 730 and SAR Logic 740. Split DACs 701-1 and 701-2 have their inputs coupled respectively to a negative voltage input (Vinn) and a positive voltage input (Vinp) and their outputs (725-1, 725-2) coupled respectively to the inverting and non-inverting inputs of a comparator 730. The output of comparator 730 is coupled with the input of the successive approximation register logic 740. Successive approximation register logic 740 provides switch control signals 741. Switch control signals 741-1 control switches of multiple split digital to analog convertor 701-1, and switch control signals 741-2 control switches of multiple split digital to analog convertor 701-2. Successive approximation register logic 740 outputs a digital value based on Vinp and Vinn. It should be appreciated that split DAC 701-1 and split DAC 701-2 can be implemented with a matched set of any of the multiple split DACs shown herein, or their like. For example, split DACs 701-1 and 701-2 can be replaced with: a matched set of two of DACs 401A, with a matched set of two of DACs 401B, with a matched set of two of DACs 501, with a matched set of two of DACs 601A, or a matched set of two of DACS 601B. An example of this is illustrated in FIG. 8 where a matched set of two DACs 401A are substituted for split DACs 701-1 and 701-2.

Although 12-bit SAR ADCs were utilized to depict the embodiments described herein, the number of bits in a SAR DAC could be any amount that can be split into three or more split DACs in the multiple split DACs 701-1, 701-2.

FIG. 8 illustrates a block diagram of a successive approximation register (SAR) analog to digital convertor (ADC) 800 implemented with multiple split digital to analog convertors (401A, 401B), according to various embodiments. SAR ADC 800 is an implementation of SAR DAC 700 using DACs 401 to replace each of DACs 701-1 and 701-2. With reference to FIG. 8, a negative voltage input, Vinn, is provided as an input to multiple split DAC 401A-1, output line 425-1 of multiple split DAC 401A-1 is coupled to the inverting input of comparator 730, and switch control signals 741-1 are provided from SAR logic 740 to control the switches of multiple split DAC 401A-1. Similarly, a positive voltage input, Vinp, is provided to as an input to multiple split DAC 401A-2, output line 425-2 of multiple split DAC 401A-2 is coupled to the non-inverting input of comparator 730, and switch control signals 741-2 are provided from SAR logic 740 to control the switches of multiple split DAC 401A-2. Vinn and Vinp may be signals that have already experienced some processing by an analog front end 305.

The concepts presented herein can also be used to implement a single-ended (SE) SAR ADC as well. The SE architecture requires only one multiple split DAC (e.g., 401A, 401B, 501, 601A, 601B, or the like), like the one connected to the inverting input of comparator 730 in FIGS. 7 and 8. The non-inverting input of comparator 730 is then tied to a common voltage, $V_{cm}$. Thus the DAC size is half of the DAC illustrated in FIGS. 7 and 8, further reducing the area of an integrated circuit utilized for forming capacitors.

The examples set forth herein were presented in order to best explain, to describe particular applications, and to thereby enable those skilled in the art to make and use embodiments of the described examples. However, those skilled in the art will recognize that the foregoing description and examples have been presented for the purposes of illustration and example only. The description as set forth is not intended to be exhaustive or to limit the embodiments to the precise form disclosed.

Reference throughout this document to "one embodiment," "certain embodiments," "an embodiment," "various embodiments," "some embodiments," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation.

What is claimed is:

1. A digital to analog convertor comprising:
an output line;
a first plurality of capacitors coupled in parallel with one another, coupled with said output line, and comprising a first least significant bit capacitor of a first capacitance value;
a second plurality of capacitors coupled in parallel with one another, coupled with said output line, and comprising a second capacitor of said first capacitance value,
wherein the first plurality of capacitors and the second plurality of capacitors have a different number of capacitors;
a third plurality of capacitors coupled in parallel with one another, coupled with said output line, and comprising a third capacitor of said first capacitance value;
a fourth plurality of capacitors coupled in parallel with one another, coupled with said output line, and comprising a smallest capacitor of said first capacitance value;
a first bridge capacitor bridging said output line between said first plurality of capacitors and said second plurality of capacitors;
a second bridge capacitor bridging said output line between said second plurality of capacitors and said third plurality of capacitors,
wherein the first plurality of capacitors, the second plurality of capacitors, the first bridge capacitor, and the second bridge capacitor form a first equivalent capacitor;
a tunable capacitor coupled in parallel with the first equivalent capacitor and the third capacitor in the third plurality of capacitors, wherein the tunable capacitor in parallel with the first equivalent capacitor has a capacitance equal to the first capacitance value; and a third bridge capacitor bridging said output line between said third plurality of capacitors and said fourth plurality of capacitors, wherein the first equivalent capacitor, the tunable capacitor, the third plurality of capacitors, and the third bridge capacitor form a second equivalent capacitor having a capacitance equal to the first capacitance value, and wherein said first and second bridge capacitors are configured with different capacitive values than one another.

2. The digital to analog convertor of claim 1, further comprising:

a first analog trim capacitor with its top plate coupled to the top plate of said first bridge capacitor and the top plate of said second capacitor of said first capacitance value.

3. The digital to analog convertor of claim 1, further comprising:

an input voltage line, wherein said first plurality of capacitors, said second plurality of capacitors, and said third plurality of capacitors are disposed to couple to said input voltage line in a top plate sampling configuration.

4. The digital to analog convertor of claim 1, further comprising:

an input voltage line, wherein said first plurality of capacitors, said second plurality of capacitors, and said third plurality of capacitors are disposed to couple to said input voltage line in a bottom plate sampling configuration.

5. A processing system for a capacitive sensing input device, said processing system comprising:

front end signal processing configured for receiving an input from a capacitive sensor and performing front end processing of said input to achieve a front-end processed input comprising a negative input voltage (Vinn) line and a positive input voltage line (Vinp); and a successive approximation analog to digital convertor configured for performing analog to digital conversion of said front-end processed input and comprising:

a comparator comprising a first input coupled with the Vinn line and a second input coupled with the Vinp line;

a successive approximation register coupled with an output of said comparator and configured for converting analog outputs of said comparator to digital values;

a first plurality of capacitors coupled in parallel with one another, coupled with said Vinn line, and comprising a first least significant bit capacitor of a first capacitance value;

a second plurality of capacitors coupled in parallel with one another, coupled with said Vinn line, and comprising a second capacitor of said first capacitance value, wherein the first plurality of capacitors and the second plurality of capacitors have a different number of capacitors;

a third plurality of capacitors coupled in parallel with one another, coupled with said Vinn line, and comprising a third capacitor of said first capacitance value;

a first bridge capacitor bridging said Vinn line between said first plurality of capacitors and said second plurality of capacitors; and a second bridge capacitor bridging said Vinn line between said second plurality of capacitors and said third plurality of capacitors, wherein the first plurality of capacitors and the first bridge capacitor form a first equivalent capacitor; and a tunable capacitor coupled in parallel with the first equivalent capacitor and the second capacitor in the second plurality of capacitors, wherein the tunable capacitor in parallel with the first equivalent capacitor has a capacitance equal to the first capacitance value, wherein the first equivalent capacitor, the tunable capacitor, the second plurality of capacitors, and the second bridge capacitor form a second equivalent capacitor with a capacitance equal to the first capacitance value, and wherein said first and second bridge capacitors are configured with different capacitive values than one another.

6. The processing system of claim 5, wherein said successive approximation analog to digital convertor further comprises:

a fourth plurality of capacitors coupled in parallel with one another, coupled with said Vinp line, and comprising a matched set to said first plurality of capacitors;

a fifth plurality of capacitors coupled in parallel with one another, coupled with said Vinp line, and comprising a matched set to said second plurality of capacitors;

a sixth plurality of capacitors coupled in parallel with one another, coupled with said Vinp line, and comprising a matched set to said third plurality of capacitors;

a third bridge capacitor bridging said Vinp line between said fourth plurality of capacitors and said fifth plurality of capacitors; and a fourth bridge capacitor bridging said Vinp line between said fifth plurality of capacitors and said sixth plurality of capacitors.

7. The processing system of claim 6, further comprising:

a seventh plurality of capacitors coupled in parallel with one another, coupled with said Vinn line, and comprising a fourth capacitor of said first capacitance value;

an eighth plurality of capacitors coupled in parallel with one another, coupled with said Vinp line, and comprising a matched set to said seventh plurality of capacitors;

a fifth bridge capacitor bridging said Vinn line between said third plurality of capacitors and said seventh plurality of capacitors; and a sixth bridge capacitor bridging said Vinp line between said sixth plurality of capacitors and said eighth plurality of capacitors.

8. The processing system of claim 7, wherein:

said first and third bridge capacitors are configured with matching capacitance values; and said second and fourth bridge capacitors are configured with matching capacitance values.

9. The processing system of claim 5, further comprising:

a first terminating capacitor having said first capacitance value and coupled to said Vinn line in parallel with said first least significant bit capacitor.

10. The processing system of claim 5, wherein said first plurality of capacitors, said second plurality of capacitors, and said third plurality of capacitors are disposed to couple to said Vinn line in a top plate sampling configuration.

11. The processing system of claim 5, wherein said first plurality of capacitors, said second plurality of capacitors, and said third plurality of capacitors are disposed to couple to said Vinn line in a bottom plate sampling configuration.

12. A capacitive sensing input device comprising:
   at least one capacitive sensor; and
   a processing system comprising:
      a successive approximation analog to digital convertor configured for performing analog to digital conversion of an input comprising a negative input voltage (Vinn) line and a positive input voltage line (Vinp), and comprising:
      a comparator comprising a first input coupled with the Vinn line and a second input coupled with the Vinp line;
      a successive approximation register coupled with an output of said comparator and configured for converting analog outputs of said comparator to digital values;
      a first plurality of capacitors coupled in parallel with one another, coupled with said Vinn line, and comprising a first least significant bit capacitor of a first capacitance value;
      a second plurality of capacitors coupled in parallel with one another, coupled with said Vinn line, and comprising a second capacitor of said first capacitance value, wherein the first plurality of capacitors and the second plurality of capacitors have a different number of capacitors;
      a third plurality of capacitors coupled in parallel with one another, coupled with said Vinn line, and comprising a third capacitor of said first capacitance value;
      a first bridge capacitor bridging said Vinn line between said first plurality of capacitors and said second plurality of capacitors;
      a second bridge capacitor bridging said Vinn line between said second plurality of capacitors and said third plurality of capacitors,
      wherein the first plurality of capacitors and the first bridge capacitor form a first equivalent capacitor; and
      a tunable capacitor coupled in parallel with the first equivalent capacitor and the second capacitor in the second plurality of capacitors,
      wherein the tunable capacitor in parallel with the first equivalent capacitor has a capacitance equal to the first capacitance value,
      wherein the first equivalent capacitor, the tunable capacitor, the second plurality of capacitors, and the second bridge capacitor form a second equivalent capacitor with a capacitance equal to the first capacitance value, and
      wherein said first and second bridge capacitors are configured with different capacitive values than one another.

13. The capacitive sensing input device of claim 12, wherein said successive approximation analog to digital convertor further comprises:
   a fourth plurality of capacitors coupled in parallel with one another, coupled with said Vinp line, and comprising a matched set to said first plurality of capacitors;
   a fifth plurality of capacitors coupled in parallel with one another, coupled with said Vinp line, and comprising a matched set to said second plurality of capacitors;
   a sixth plurality of capacitors coupled in parallel with one another, coupled with said Vinp line, and comprising a matched set to said third plurality of capacitors;
   a third bridge capacitor bridging said Vinp line between said fourth plurality of capacitors and said fifth plurality of capacitors; and
   a fourth bridge capacitor bridging said Vinp line between said fifth plurality of capacitors and said sixth plurality of capacitors.

14. The capacitive sensing input device of claim 13, further comprising:
   a seventh plurality of capacitors coupled in parallel with one another, coupled with said Vinn line, and comprising a fourth capacitor of said first capacitance value;
   an eighth plurality of capacitors coupled in parallel with one another, coupled with said Vinp line, and comprising a matched set to said seventh plurality of capacitors;
   a fifth bridge capacitor bridging said Vinn line between said third plurality of capacitors and said seventh plurality of capacitors; and
   a sixth bridge capacitor bridging said Vinp line between said sixth plurality of capacitors and said eighth plurality of capacitors.

15. The capacitive sensing input device of claim 14, wherein:
   said first and third bridge capacitors are configured with matching capacitance values; and
   said second and fourth bridge capacitors are configured with matching capacitance values.

16. The capacitive sensing input device of claim 12, further comprising:
   a first terminating capacitor having said first capacitance value and coupled to said Vinn line in parallel with said first least significant bit capacitor.

* * * * *